United States Patent
Boldrini et al.

(10) Patent No.: US 12,128,904 B2
(45) Date of Patent: Oct. 29, 2024

(54) METHOD AND SYSTEM FOR THE RECOGNITION OF THE IRREGULARITIES OF A ROAD PAVEMENT

(71) Applicant: Bridgestone Europe NV/SA [BE/BE], Zaventem (BE)

(72) Inventors: Alessandro Boldrini, Rome (IT); Marco Pascucci, Rome (IT); Alessandra Magliozzi, Rome (IT); Valerio Bortolotto, Rome (IT); Lorenzo Alleva, Rome (IT); Vittorio Nicolosi, Rome (IT)

(73) Assignee: Bridgestone Europe, NV/SA, Zaventem (BE)

( * ) Notice: Subject to any disclaimer, the term of this patent is extended or adjusted under 35 U.S.C. 154(b) by 619 days.

(21) Appl. No.: 17/608,826

(22) PCT Filed: May 4, 2020

(86) PCT No.: PCT/IB2020/054200
§ 371 (c)(1),
(2) Date: Nov. 4, 2021

(87) PCT Pub. No.: WO2020/225702
PCT Pub. Date: Nov. 12, 2020

(65) Prior Publication Data
US 2022/0274600 A1    Sep. 1, 2022

(30) Foreign Application Priority Data
May 7, 2019    (IT) .......... 102019000006614

(51) Int. Cl.
*B60W 40/06*    (2012.01)
*G01B 21/30*    (2006.01)
(Continued)

(52) U.S. Cl.
CPC .......... *B60W 40/06* (2013.01); *G01B 21/30* (2013.01); *G01S 19/01* (2013.01); *G06F 30/23* (2020.01);
(Continued)

(58) Field of Classification Search
CPC .......... B60W 40/06; B60W 2552/35; B60W 2556/45; B60W 2520/10; B60W 2520/28; B60W 2540/18; G01B 21/30; G01S 19/01
See application file for complete search history.

(56) References Cited

U.S. PATENT DOCUMENTS

| 6,202,020 B1 * | 3/2001 | Kyrtsos ............... B60T 8/172 701/80 |
| 9,983,093 B2 * | 5/2018 | Allen ............... G01M 5/0025 |

(Continued)

FOREIGN PATENT DOCUMENTS

| DE | 102007054082 A1 | 7/2008 |
| DE | 202009012128 A1 | 9/2010 |

(Continued)

OTHER PUBLICATIONS

Perttunen Mikko et al: "Distributed Road Surface Condition Monitoring Using Mobile Phones", Sep. 2, 2011 (Sep. 2, 2011), Pervasive: International Conference on Pervasive Computing; [Lecture Notes in Computer Science; Lect Notes Computer], Springer, Berlin, Heidelberg, pp. 64-78, XP047434651, ISBN: 978-3-642-17318-9, p. 64-67, p. 70.

(Continued)

*Primary Examiner* — Edwin A Young
(74) *Attorney, Agent, or Firm* — Patterson Intellectual Property Law, PC

(57) ABSTRACT

The invention concerns a method and a system for recognizing the presence of any irregularities of any road pavement.

14 Claims, 2 Drawing Sheets

(51) Int. Cl.
*G01S 19/01* (2010.01)
*G06F 30/23* (2020.01)
*G07C 5/00* (2006.01)
*G07C 5/02* (2006.01)

(52) U.S. Cl.
CPC ............... *G07C 5/008* (2013.01); *G07C 5/02* (2013.01); *B60W 2520/10* (2013.01); *B60W 2520/28* (2013.01); *B60W 2540/18* (2013.01); *B60W 2552/35* (2020.02); *B60W 2556/45* (2020.02)

(56) References Cited

U.S. PATENT DOCUMENTS

| | | | |
|---|---|---|---|
| 2015/0051785 A1* | 2/2015 | Pal | G01P 15/18 701/29.1 |
| 2016/0250983 A1* | 9/2016 | Miller | B60W 40/09 340/439 |
| 2017/0284824 A1 | 10/2017 | Korzunov | |

FOREIGN PATENT DOCUMENTS

| | | |
|---|---|---|
| DE | 102015203062 A1 | 8/2016 |
| DE | 102015003115 A1 | 9/2016 |
| WO | 2011054363 A1 | 5/2011 |

OTHER PUBLICATIONS

Anonymous: "Resonance and Natural Frequency—Pico Technology", Sep. 22, 2017 (Sep. 22, 2017), XP055646756, Retrieved from the Internet: URL: https://www.picoauto.com/support/topic18151.html [retrieved on Nov. 4, 2021] p. 1.

International Search Authority: European Patent Office search in corresponding international application No. PCT/IB2020/054200 dated Aug. 12, 2020, 3 pages.

* cited by examiner

METHOD AND SYSTEM FOR THE RECOGNITION OF THE IRREGULARITIES OF A ROAD PAVEMENT

TECHNICAL SECTOR

The present invention relates to a method and a system for the recognition of the irregularities of a road pavement.

PRIOR ART

Road pavements must be designed in such a way as to ensure a rolling surface that is substantially regular and with little deformation in order to meet safety and comfort requirements for the motor vehicles that drive on them. As is known, in fact, the impact of a wheel of a motor vehicle against any obstacle on the road pavement (such as, for example, a sidewalk, a pothole or a speed ramp) may cause damage to the wheel pneumatic tyre, in particular to the carcass (i.e., the casing) of the pneumatic tyre.

More specifically, a protuberance that is externally visible upon the side of a pneumatic tyre typically indicates that some cords have been broken within the carcass due to an impact since driving over objects such as curbs, speed ramps and potholes may cause individual cords to break.

If a damaged pneumatic tyre (e.g. a pneumatic tyre with some damaged cords) is not detected promptly and, therefore, is not promptly repaired or replaced, in continuing to drive with the damaged pneumatic tyre there is a risk of completely breaking/destroying the carcass of the pneumatic tyre and also of damaging the wheel rim and/or the suspension (e.g. in the case of further impacts to the damaged pneumatic tyre against other obstacles).

Until now, systems were periodically implemented in order to monitor the level of regularity of individual roads, mainly for the purpose of planning maintenance work. Typically, said monitoring systems are based upon a calculation of the the International Roughness Index (IRI), which represents international index for the irregularity of road pavements.

However, in recent years, within the automotive sector, there has been a strong need for technologies for detecting road surface conditions that are able to automatically and continuously detect the presence of potential obstacles (such as sidewalks, potholes or speed ramps) and that are able to promptly report them to the drivers of such motor vehicles.

DE102009012128 discloses a method for determining roughness of roadway surface for vehicle.

DE102007054082 discloses a rough road detection system used in an on-board diagnostic system.

DE102015203062 discloses a method and device for detecting the road condition for a vehicle.

WO2011054363 discloses a method for estimating the ground condition under a driving vehicle.

DESCRIPTION OF THE INVENTION

The aim of the present invention is thus to provide a method for the recognition of the irregularities of a road pavement that is free from the disadvantages of the state of the art and that is, in particular, easy and inexpensive to implement.

A further aim of the present invention is thus to provide a system for the recognition of the irregularities of a road pavement that is free from the disadvantages of the state of the art and that is, in particular, easy and inexpensive to implement.

According to the present invention a method and a system are provided for the recognition of the irregularities of a road pavement according to that determined within the attached claims.

BRIEF DESCRIPTION OF THE DRAWINGS

The present invention will now be described with reference to the attached drawings that show an exemplary, non-limiting embodiment, wherein.

PREFERRED EMBODIMENTS OF THE INVENTION

The applicant has experimentally verified that the normalized wheel speed (i.e., the ratio between an acquired/measured wheel speed and the corresponding motor vehicle speed) is relating to the wheel driving over or impacting an irregularity within the road pavement. In the following section, the term irregularity refers to any obstacle potentially present upon the road pavement (such as sidewalks, potholes, curbs, speed ramps, etc.).

Based upon the results of the tests performed, the applicant has designed and developed innovative technology to detect the irregularities of the road pavement, described in the following section and including a preliminary step and an actual irregularity detection step.

More specifically, the preliminary step for the optimization of this technology involves the execution of tests that envisage pneumatic tyres driving over or impacting different types of irregularity and at different speeds of the motor vehicle. The preliminary testing step is also conducted with different types of pneumatic tyres with specific characteristics (in terms of pressure, size and stiffness) and with different types of vehicles with specific characteristics (for example, in terms of shock absorber stiffness).

In particular, at least three test campaigns were followed in order to study the response in relation to:
(i) the state of the road pavement and the types of irregularities of the road pavement;
(ii) the type of motor vehicle and type of pneumatic tyre; and
(iii) the speed of the motor vehicle.

Figure 1:
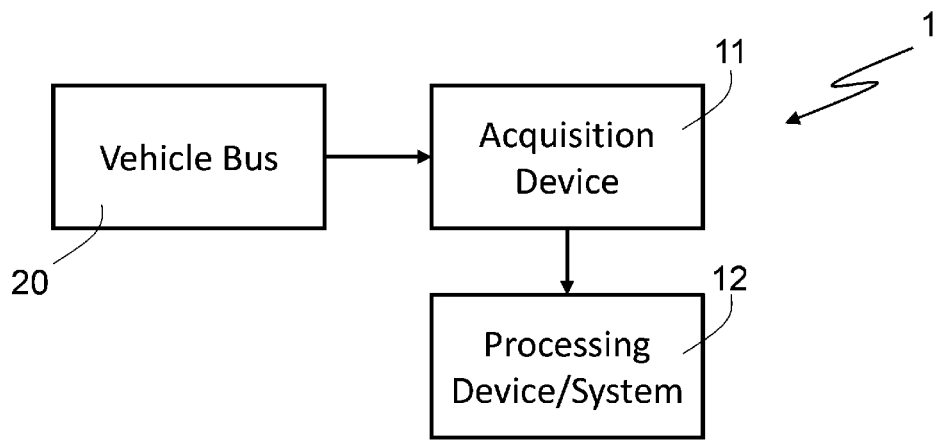
FIG. 1 schematically illustrates a first embodiment of a system that implements the method for the recognition of the irregularities of a road pavement that is the object of the present invention.

FIG. 1 schematically illustrates, by means of a block diagram, the functional architecture of a system 1 for the recognition of irregularities of a road pavement.

In particular, the system 1 for the recognition of irregularities of the road pavement includes an acquisition device 11 that is installed on board a motor vehicle equipped with two or more wheels, each equipped with a pneumatic tyre, and coupled to a vehicle bus 20 (e.g. based upon a standard Controller Area Network (CAN) bus) of said motor vehicle.

According to a preferred variant, the acquisition device 11 is fixed/bound to the chassis of the motor vehicle. In particular, the acquisition device 11 is connected to the chassis of the motor vehicle in such a way that the acquisition device 11 is subjected to the same vibrations to which the chassis of the motor vehicle is subjected.

Preferably, the acquisition device 11 is placed near an OBD connector of the motor vehicle.

The system 1 for the recognition of irregularities of a road pavement also comprises a processing device 12 that is connected, in wired or wireless mode, to the acquisition device 11.

The acquisition device 11 is configured to acquire, from the vehicle bus 20, signals that are indicative of the speed of the motor vehicle and the speed of a wheel of said motor vehicle (speed signals that are, for convenience, expressed in kilometers or miles per hour). Furthermore, the acquisition device 11 is configured to provide, at the output, measurements that are indicative of the speeds of the motor vehicle and the speed of the wheel thereof.

The acquisition device 11 is also configured to acquire, from the vehicle bus 20, signals linked to the driving of the motor vehicle. In particular, the acquisition device 11 is configured to acquire, from the vehicle bus 20, signals such as vertical acceleration, yaw rate, pitch and roll (by means of a gyroscope), the steering angle of the vehicle and information relating to the position of the vehicle (by means of a GPS signal).

According to a first embodiment, the processing device 12 is configured to receive, from the acquisition device 11, those measurements that are indicative of the speeds of the motor vehicle and the speed of the wheel of said motor vehicle. In addition, the processing device 12 is configured to receive, from the acquisition device 11, also those measurements that are indicative of the steering angle of the vehicle and information in relation to the position of the vehicle (by means of a GPS signal).

In more detail, the acquisition of the signal relating to the wheel speed is performed with a sampling frequency of at least 50 Hz. Preferably, the acquisition of the signal relating to the speed of the wheel speed is performed with a sampling frequency of 100 Hz.

The processing device 12 is intended for the analysis of that measurement that is indicative of the steering angle of the wheel of said motor vehicle, wherefore transformations that alter the distribution of said measurement are used. In particular, the processing device 12 performs a FFT (Fast Fourier Transform) of that measurement that is indicative of the steering angle of the wheel of said motor vehicle, over a reference section of the road pavement of variable length. The reference section of the road pavement has a variable and/or adjustable length; the reference section of the road pavement has a length of between 2 and 25 linear meters, preferably between 5 and 10 linear meters.

Said analysis, by means of the FFT, makes it possible to identify the frequency content of that measurement that is indicative of the steering angle of the wheel; moreover, said analysis makes it possible to highlight a minimum threshold that varies according to the driving style of the driver of the motor vehicle within the reference section.

The processing device 12 is thus configured such as to perform filtering of that measurement that is indicative of the speed of the wheel of the motor vehicle. The filtering of that measurement that is indicative of the speed of the wheel of the motor vehicle is also performed over the reference section of the road pavement.

The filtering is at least of the high-pass type; preferably, the filtering is of the band-pass type. The minimum threshold determined during the previous section by the analysis of that measurement that is indicative of the steering angle of the wheel is used within the high-pass filter; in this way it is possible to analyze only that part of the signal containing information relating to the irregularities of the road pavement and not to the driving style of the driver of the vehicle.

The processing device 12 is then configured to calculate, on the basis of those measurements that are indicative of the speeds of the motor vehicle and of the speeds of the wheel thereof, a normalized wheel speed that is indicative of a ratio (preferably a percentage ratio) of the wheel speed in relation to the speed of the motor vehicle.

Alternatively, the processing device 12 is configured to calculate, on the basis of those measurements that are indicative of the speeds of the motor vehicle and of the speeds of the wheel thereof, a normalized wheel speed that is indicative of a ratio (preferably, a percentage ratio) of the wheel speed in relation to the motor vehicle speed and to subsequently perform the filtering of the normalized wheel speed, over the reference section of the road pavement.

The processing device 12 is thus configured to calculate the standard deviation of said normalized wheel speed over the reference section of the road pavement.

The preliminary step described above involves determining, on the basis of the results of the tests performed, one or more predefined models in order to associate the standard deviation of the normalized wheel speed, over the reference section, with the presence of irregularities of the road pavement. In essence, the preliminary test step includes, in succession, a sub-step in which tests are performed in having pneumatic tyres driving over and/or impacting different irregularities at different speeds of the motor vehicle; a sub-step in which, during the tests performed, the wheel speeds and the speeds of the motor vehicle are acquired and the normalized wheel speeds are calculated in relation to those tests performed by means of the ratio between the wheel speeds and the respective speeds of the motor vehicle; and a sub-step for the construction of at least one model for associating the standard deviation of the normalized speeds with the irregularities on the road pavement. Preferably, the preliminary test step involves the construction of a number of models depending upon the type of pneumatic tyre and the type of motor vehicle.

The standard deviation of said normalized wheel speed is thus compared with the predefined models developed during the preliminary test step and used to recognize the presence of irregularities of the road pavement. An irregularity that has been recognized can be located by means of information relating to the position of the vehicle (by means of a GPS signal).

According to a further embodiment, the processing device 12 is configured to receive, from the acquisition device 11, those measurements that are indicative of vertical acceleration (along the z axis). Furthermore, the processing device 12 is configured to receive, from the acquisition device 11, also those measurements that are indicative of the steering angle and information in relation to the position of the vehicle (by means of a GPS signal). The acquisition device 11 is also configured to acquire, from the vehicle bus 20, and transmit to the processing device 12, signals in relation to the driving of the motor vehicle. In particular, the acquisition device 11 is configured to acquire, from the vehicle bus 20, signals such as yaw rate, pitch and roll (by means of a gyroscope).

In more detail, the acquisition of the signal relating to vertical acceleration is performed with a sampling frequency of at least 10 Hz.

The processing device 12 is thus configured to initially perform filtering of that measurement that is indicative of vertical acceleration. The filtering of that measurement that is indicative of vertical acceleration is performed over a reference section of the road pavement of variable length. The reference section of the road pavement has a variable and/or adjustable length; the reference section of the road pavement has a length of between 2 and 25 linear meters, preferably between 5 and 10 linear meters.

The filtering is preferably of the high-pass type; the minimum filtering threshold of the high-pass filter is preferably less than or equal to 0.1 Hz.

Once the high-pass filtering has been performed, the processing device 12 is intended to analyze that measurement that is indicative of vertical acceleration by means of a transformation that alters the distribution of said measure. In particular, the processing device 12 performs a FFT (Fast Fourier Transform) of that measurement that is indicative of vertical acceleration over the reference section.

Said analysis by means of the FFT makes it possible to identify the frequency content of that measurement that is indicative of vertical acceleration over the reference section.

The processing device 12 is thus configured to calculate the standard deviation of that measurement that is indicative of vertical acceleration over the reference section. In particular, the processing device 12 is configured to calculate the standard deviation of that measurement that is indicative of vertical acceleration over the reference section and at relevant frequencies. Preferably the relevant frequencies include a first range of frequencies of vibration of the suspension system of the motor vehicle; preferably the first frequency range is between 1.5 Hz and 3 Hz. Preferably the relevant frequencies also include a second range of frequencies of vibration of the chassis of the motor vehicle.

The preliminary step described above involves determining, on the basis of the results of the tests performed, one or more predefined models in order to associate the standard deviation of that measurement that is indicative of vertical acceleration over the reference section and at relevant frequencies with the presence and size of irregularities of the road pavement.

In essence, the preliminary test step includes, in succession, a sub-step in which to perform the tests by having pneumatic tyres driving over and/or impacting different irregularities at different speeds of the motor vehicle; a sub-step in which to acquire the vertical acceleration during the tests performed; and a sub-step of construction of at least one model for associating the standard deviation of the vertical acceleration with the presence and size of the irregularities of the road pavement.

Preferably, the preliminary test step involves the construction of a number of models depending upon the type of pneumatic tyre and the type of motor vehicle.

The standard deviation of said measurement that is indicative of the vertical acceleration over the reference section is thus compared with the predefined models developed during the preliminary test step and used to recognize the presence of irregularities of the road pavement. An irregularity that has been recognized can be located by means of information relating to the position of the vehicle (by means of a GPS signal).

The first and second embodiments described in the previous section can be used alternatively in order to recognize the presence of irregularities of the road pavement. The first and second embodiments described in the previous section can be used at the same time and in parallel in order to recognize, with a higher degree of precision and more reliably, the presence of irregularities of the road pavement.

Figure 2:
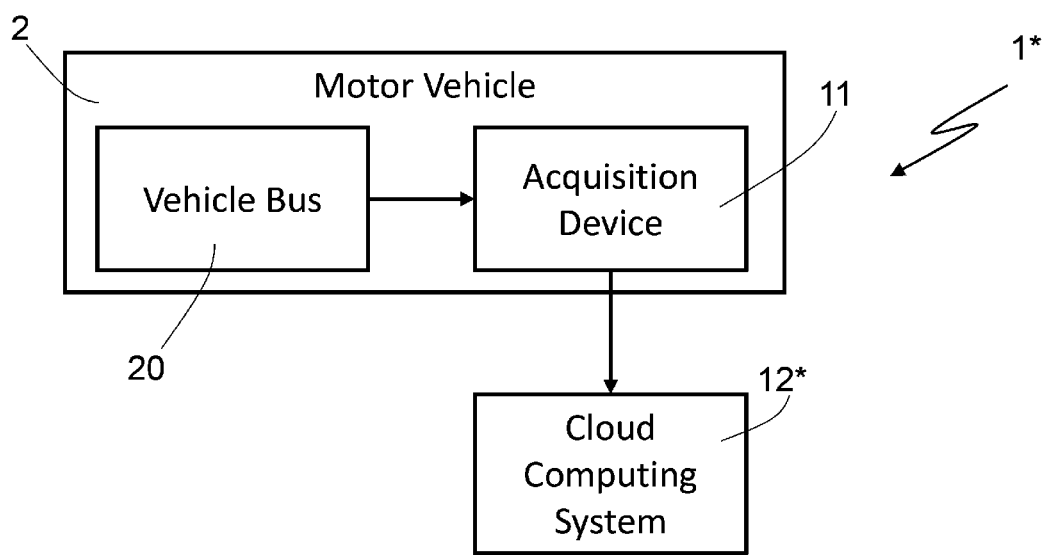
FIG. 2 schematically illustrates a first variant of the system in FIG. 1.

FIG. 2 schematically illustrates a first variant of the system 1* for the recognition of irregularities of the road pavement wherein the processing device 12 is implemented/carried out by means of a cloud-type computing system 12* that is remotely wirelessly connected to the acquisition device 11 (e.g. by means of one or more mobile communication technologies, such as GSM, GPRS, EDGE, HSPA, UMTS, LTE, LTE Advanced and/or 5th generation wireless communication systems (or even beyond)).

Figure 3:
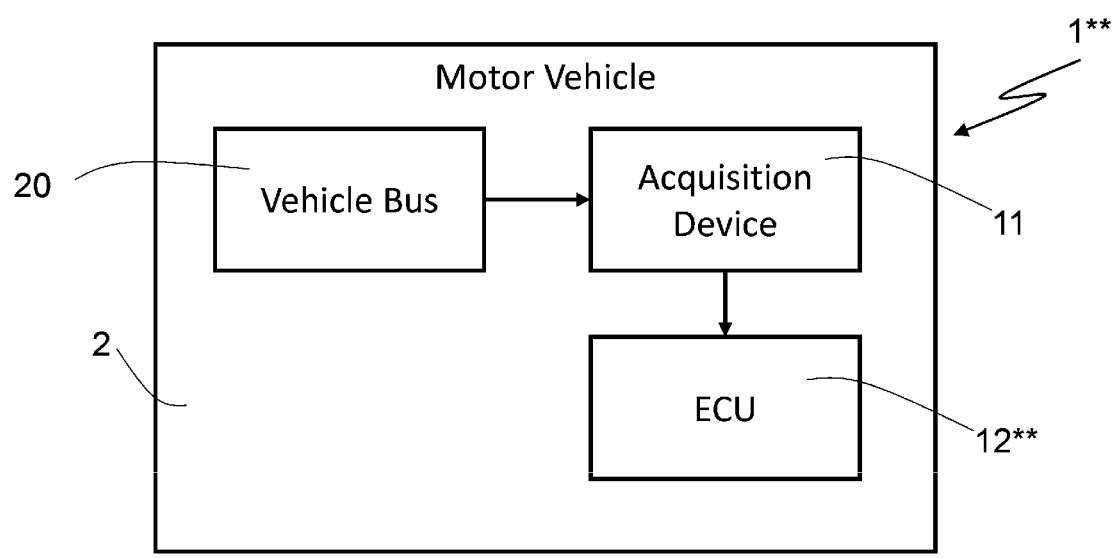
FIG. 3 schematically illustrates a second variant of the system in FIG. 1.

In contrast, with reference to FIG. 3, in a second variant of the system 1 for the recognition of irregularities of the road pavement, the processing device 12 is implemented/carried out by means of a motor vehicle's electronic control unit (ECU) 12 installed on board the motor vehicle 2. The electronic control unit 12** can conveniently be a control unit specifically dedicated to the recognition of irregularities of the road pavement, or a control unit dedicated to various tasks that also include the recognition of the irregularities of the road pavement.

The invention claimed is:

1. A method for recognition of irregularities of a road pavement, the method comprising:
   a test stage comprising:
      performing tests in having pneumatic tires driving over and/or impacting different irregularities at different speeds of a motor vehicle;
      during the tests performed, acquiring wheel speeds and speeds of the motor vehicle and calculating normalized wheel speeds relating to the tests performed via a ratio between the wheel speeds and the respective speeds of the motor vehicle; and
      construction of at least one model for associating a standard deviation of the normalized wheel speeds relating to the tests performed with the irregularities on the road pavement; and
   an actual recognition stage comprising:
      acquiring a steering angle of a wheel of said motor vehicle;
      processing the steering angle of the wheel of said motor vehicle via a fast Fourier transform;
      identifying a minimum threshold in frequency content of the steering angle of the wheel processed via the fast Fourier transform;
      acquiring wheel speeds and speeds of the motor vehicle;
      calculating normalized wheel speeds via a ratio between the wheel speeds and the respective speeds of the motor vehicle;
      carrying out high-pass type filtering of the wheel speeds or of the normalized wheel speeds via said minimum threshold;
      calculating a standard deviation of the normalized wheel speeds; and
      recognizing the presence of irregularities on the road pavement based upon a comparison between said model and the standard deviation of the normalized wheel speeds.

2. The method of claim 1, further comprising analyzing the steering angle of the wheel of said motor vehicle, the wheel speeds, and the speeds of the motor vehicle over a reference section of the road pavement of variable and/or adjustable length.

3. The method of claim 2, wherein the reference section of the road pavement has a length of between 2 and 25 linear meters.

4. The method of claim 3, wherein the reference section of the road pavement has a length between 5 and 10 linear meters.

5. The method of claim 1, wherein the acquiring of wheel speeds is performed at a sampling rate of at least 50 Hz.

6. The method of claim 5, wherein the acquiring of wheel speeds is performed at a sampling rate of at least 100 Hz.

7. The method of claim 1, wherein the actual recognition stage further comprises acquiring information regarding a position of the vehicle via a GPS signal, and locating any irregularities depending upon the position of the vehicle.

8. The method of claim 1, wherein the test stage further comprises performing the tests with different types of pneumatic tires on different types of motor vehicles driving over and/or impacting the different irregularities, and constructing a number of models to associate the standard deviation of the normalized wheel speeds relating to the tests performed with the type of pneumatic tire and/or motor vehicle.

9. A system for recognition of irregularities of a road pavement, the system comprising:
   an acquisition device installed on board a motor vehicle provided with two or more wheels fitted with pneumatic tires, wherein the acquisition device is coupled to a vehicle bus of the motor vehicle and configured to
      acquire, from the vehicle bus, signals that are indicative of a speed of the motor vehicle, a speed of a wheel of said motor vehicle, and a steering angle of the wheel of said motor vehicle, and
      provide, as an output, measurements that are indicative of the speed of the motor vehicle, the speed of the wheel of said motor vehicle, and the steering angle of the wheel of said motor vehicle; and
   a processing device configured to store at least one model of recognition of the irregularities of the road pavement and to receive, from the acquisition device, those measurements that are indicative of the speed of the motor vehicle, the speed of the wheel of said vehicle, and the steering angle of the wheel of said vehicle;
   wherein the processing device is further programmed to:
      process the measurements relating to the steering angle of the wheel of said motor vehicle and to calculate, based on the measurements that are indicative of the speed of the motor vehicle and the speed of the wheel of said motor vehicle, a normalized wheel speed that is indicative of a ratio of the wheel speed in relation to the speed of the motor vehicle; and
      recognize a presence of irregularities of the road pavement based upon a comparison between said model and the standard deviation of the normalized wheel speeds.

10. The system of claim 9, wherein the acquisition device is fixed/bound to a chassis of the motor vehicle.

11. The system of claim 10, wherein the acquisition device is fixed/bound to the chassis of the motor vehicle such that the acquisition device is commonly subjected to vibrations to which the chassis of the motor vehicle is subjected.

12. The system of claim 9, wherein the acquisition device is placed near an OBD connector of the motor vehicle.

13. The system of claim 9, wherein the processing device is a cloud-type computing system that is remotely wirelessly connected to the acquisition device.

14. The system of claim 9, wherein the processing device is an electronic control unit installed on board the motor vehicle.

* * * * *